United States Patent
Katz et al.

(10) Patent No.: US 11,508,683 B2
(45) Date of Patent: Nov. 22, 2022

(54) SEMICONDUCTOR DEVICE WITH DIE BUMPS ALIGNED WITH SUBSTRATE BALLS

(71) Applicant: WESTERN DIGITAL TECHNOLOGIES, INC., San Jose, CA (US)

(72) Inventors: Arkady Katz, Beer Sheva (IL); Victor Kviat, Beer Sheva (IL)

(73) Assignee: Western Digital Technologies, Inc., San Jose, CA (US)

( * ) Notice: Subject to any disclaimer, the term of this patent is extended or adjusted under 35 U.S.C. 154(b) by 655 days.

(21) Appl. No.: 16/442,983

(22) Filed: Jun. 17, 2019

(65) Prior Publication Data
US 2020/0395326 A1    Dec. 17, 2020

(51) Int. Cl.
*H01L 23/00* (2006.01)
*H01L 23/522* (2006.01)

(52) U.S. Cl.
CPC .......... *H01L 24/17* (2013.01); *H01L 23/5226* (2013.01); *H01L 24/09* (2013.01); *H01L 2924/381* (2013.01)

(58) Field of Classification Search
CPC ..... H01L 24/17; H01L 23/5226; H01L 24/09; H01L 2924/381
See application file for complete search history.

(56) References Cited

U.S. PATENT DOCUMENTS

| | | | | |
|---|---|---|---|---|
| 5,567,655 A | * | 10/1996 | Rostoker | H01L 24/06 228/180.21 |
| 5,818,114 A | * | 10/1998 | Pendse | H01L 24/85 257/786 |
| 5,885,855 A | | 3/1999 | Liang | |
| 5,952,726 A | | 9/1999 | Liang | |
| 6,057,601 A | * | 5/2000 | Lau | H01L 23/3128 257/690 |
| 6,168,854 B1 | * | 1/2001 | Gibbs | H05K 1/112 428/209 |
| 6,657,870 B1 | * | 12/2003 | Ali | H01L 23/49838 174/250 |
| 7,141,819 B2 | * | 11/2006 | Maruko | H01L 22/32 257/48 |
| 7,372,169 B2 | * | 5/2008 | Chang | H01L 23/49816 257/693 |

(Continued)

OTHER PUBLICATIONS

Totta et al., "Chip-To-Package Interconnections", R.R. Tummala et al (eds.), Microelectronics Packaging Handbook, (c) Springer Science and Business Media Dordrecht, 1997 (Year: 1997).*

(Continued)

*Primary Examiner* — Didarul A Mazumder
*Assistant Examiner* — Gustavo G Ramallo
(74) *Attorney, Agent, or Firm* — Vierra Magen Marcus LLP

(57) ABSTRACT

A semiconductor device is disclosed including a semiconductor die mounted on a substrate. The substrate includes a pattern of solder balls which is complementary and aligned to a pattern of solder bumps on the semiconductor die. These complementary and aligned patterns of solder balls and solder bumps minimize the lengths of current paths between the solder balls and solder bumps, and provide current paths between the solder balls and solder bumps of relatively uniform lengths.

14 Claims, 9 Drawing Sheets

(56) References Cited

U.S. PATENT DOCUMENTS

| | | | | |
|---|---|---|---|---|
| 7,652,379 | B2* | 1/2010 | Poddar | H01L 24/03 |
| | | | | 257/758 |
| 8,350,375 | B2* | 1/2013 | Ali | H01L 23/5286 |
| | | | | 257/691 |
| 8,674,505 | B2* | 3/2014 | Rhyner | H01L 23/49816 |
| | | | | 257/738 |
| 9,064,858 | B2 | 6/2015 | Pendse | |
| 9,355,951 | B2* | 5/2016 | Kao | H01L 24/14 |
| 10,177,107 | B2* | 1/2019 | Camarota | H01L 23/5286 |
| 2001/0039642 | A1 | 11/2001 | Anzai | |
| 2005/0248040 | A1* | 11/2005 | Osburn | H01L 23/49838 |
| | | | | 257/786 |
| 2007/0096338 | A1* | 5/2007 | Kim | H05K 3/3436 |
| | | | | 257/780 |
| 2011/0001249 | A1 | 1/2011 | Law et al. | |
| 2014/0036454 | A1* | 2/2014 | Caskey | H01L 23/49838 |
| | | | | 361/735 |
| 2015/0048480 | A1 | 2/2015 | Kim et al. | |
| 2015/0228569 | A1* | 8/2015 | Wang | H01L 23/49811 |
| | | | | 361/771 |
| 2018/0005972 | A1* | 1/2018 | Hossain | H01L 22/26 |
| 2019/0148323 | A1 | 5/2019 | Gu et al. | |
| 2019/0311983 | A1* | 10/2019 | Raorane | H01L 23/5283 |
| 2020/0043530 | A1* | 2/2020 | Shibata | G11C 5/063 |
| 2020/0205299 | A1* | 6/2020 | Thibado | H05K 3/3494 |
| 2021/0050318 | A1* | 2/2021 | Marquart | H01L 25/0655 |
| 2021/0183773 | A1* | 6/2021 | Rubin | H01L 25/18 |
| 2021/0407948 | A1* | 12/2021 | Kim | H01L 23/585 |

OTHER PUBLICATIONS

International Search Report and Written Opinion dated Apr. 22, 2020 in International Patent Application No. PCT/US2019/066403.

* cited by examiner

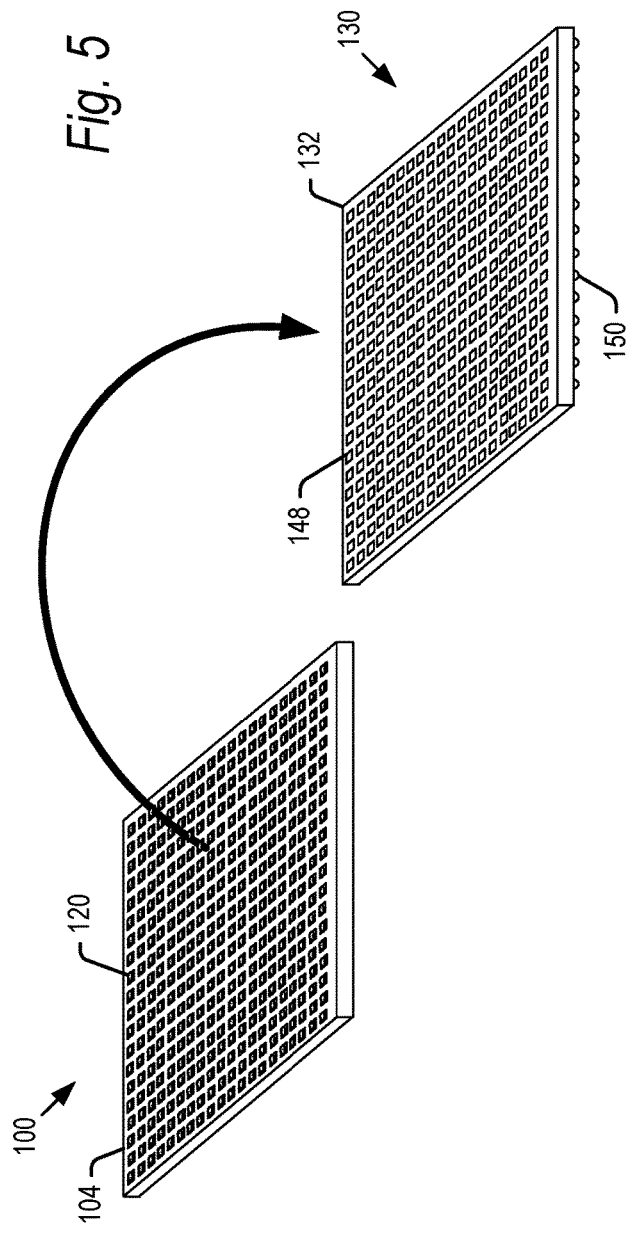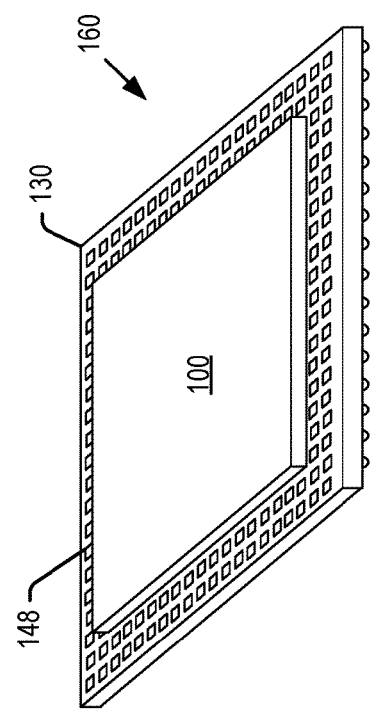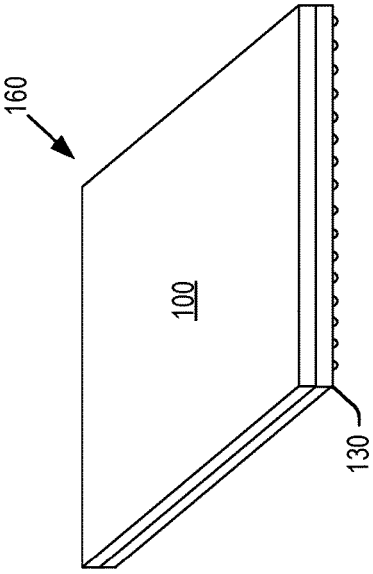

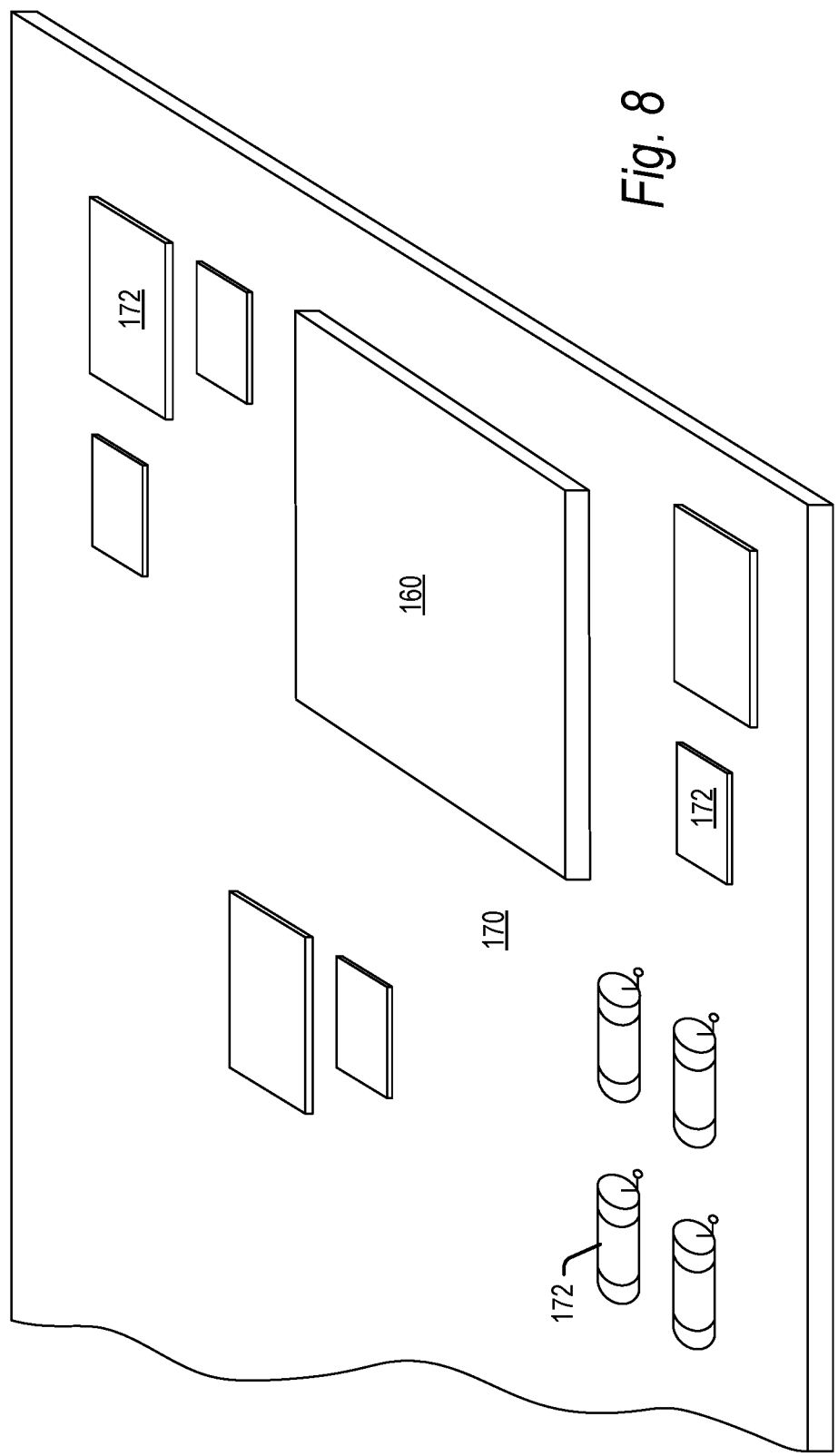

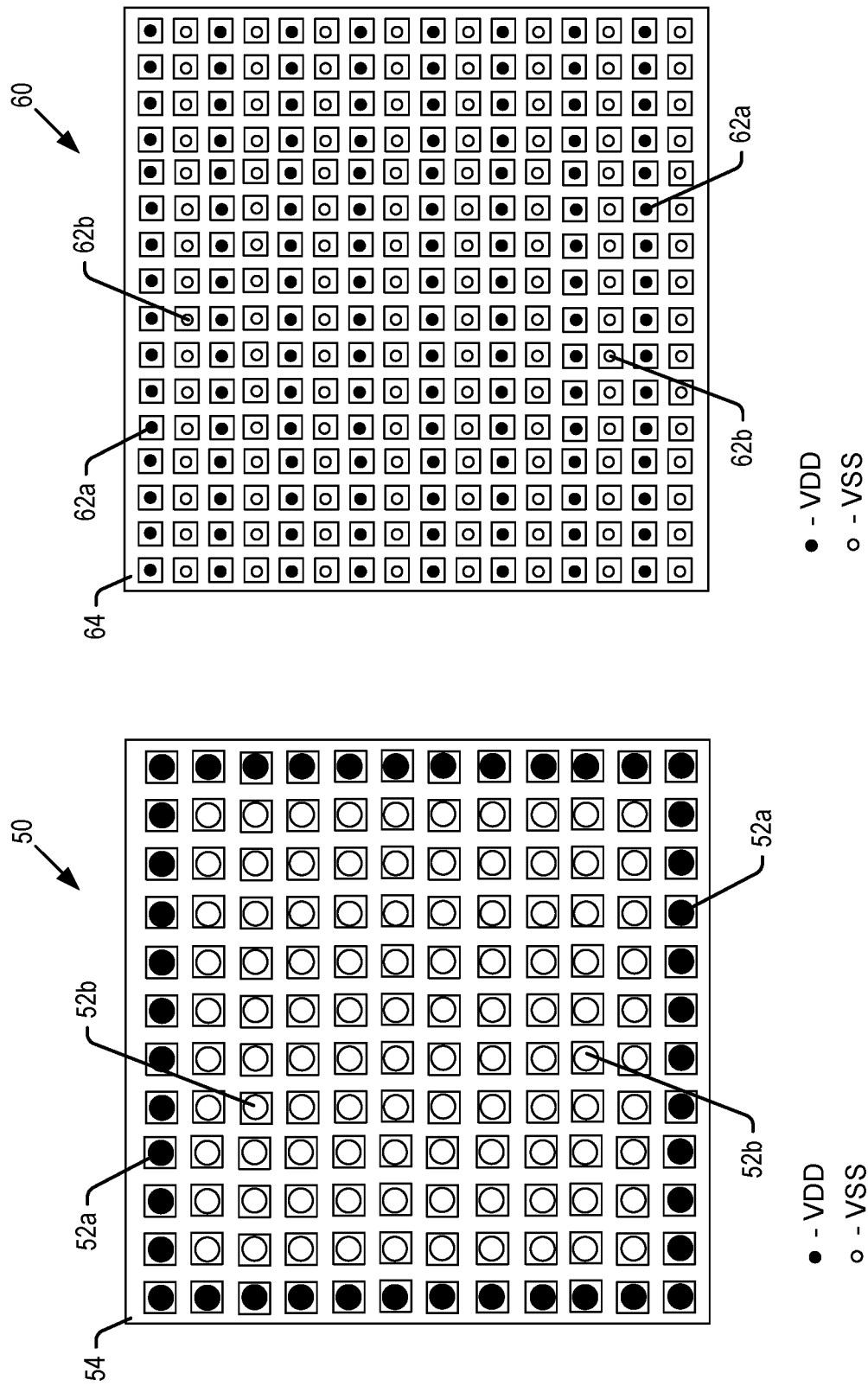

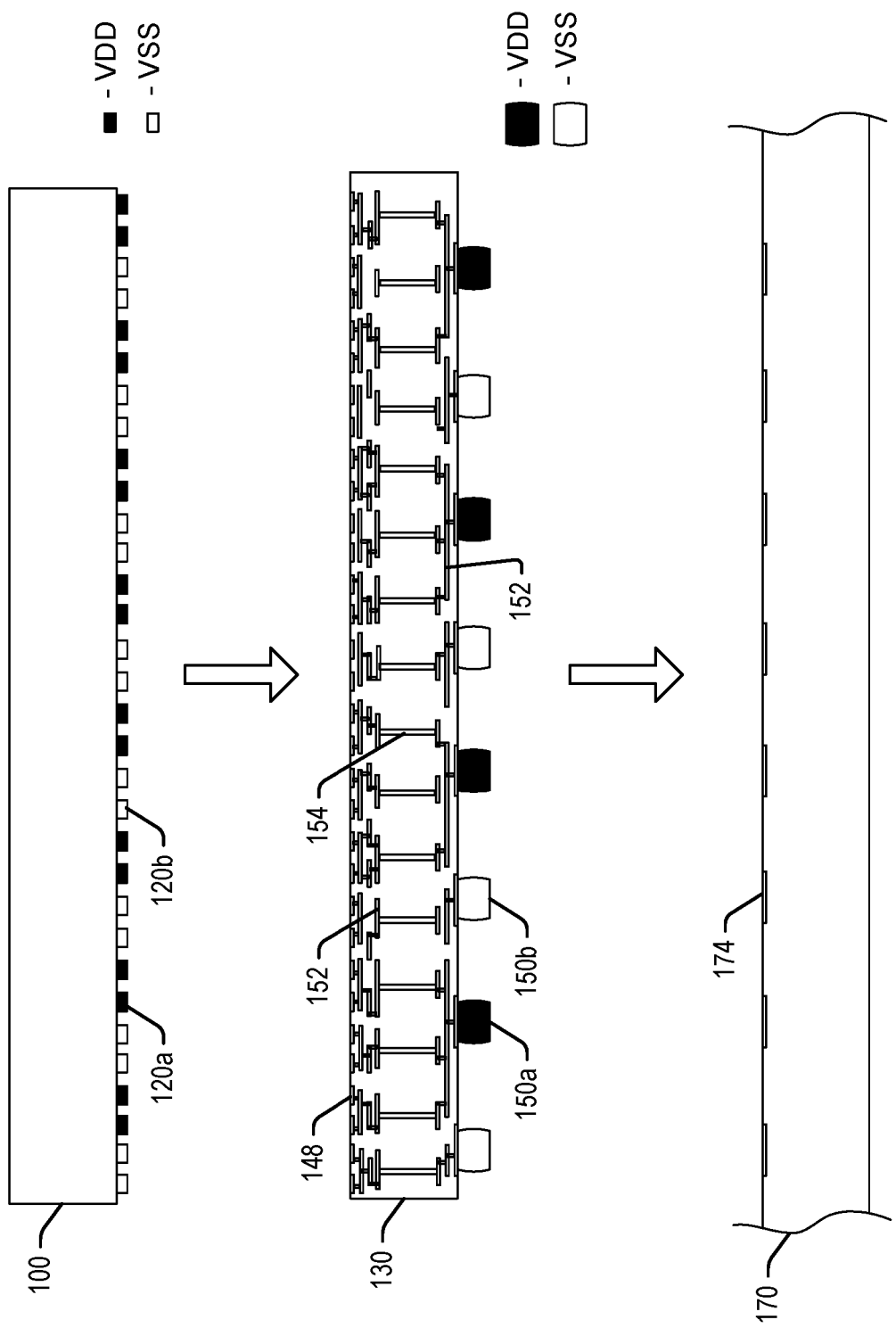

SEMICONDUCTOR DEVICE WITH DIE BUMPS ALIGNED WITH SUBSTRATE BALLS

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory semiconductor products may in general be fabricated as system-in-a-package (SIP) or multichip modules (MCM), where one or more semiconductor dies are mounted and interconnected to an upper surface of substrate. The substrate may in general include a rigid, dielectric base having a conductive layer etched on one or both sides. Solder balls are often mounted on contact pads formed on a lower surface of the substrate to allow the substrate to be soldered to a host device such as a printed circuit board.

Once mounted, signals may be transferred between the semiconductor die in the package and the host device via the substrate. For example, a high-voltage current, VDD, may travel from the host device to the substrate via the solder balls on the bottom of the substrate. The VDD current may then travel through a pattern of electrical traces, vias and contact pads of substrate to a semiconductor die mounted on an upper surface of the substrate.

In the standard approach, the solder balls carrying VDD current are arranged around an outer periphery of the substrate. Low-voltage current, VSS, solder balls are located within a center portion of the bottom surface of the substrate. On the semiconductor side, the bumps carrying the high-voltage VDD current art traditionally in alternating rows, with the low-voltage VSS current.

This configuration of solder balls on the substrate and bumps in the semiconductor die is suboptimal. For example, there can be a relatively long current path for the high-voltage VDD signal from a given solder ball in the substrate to a given bump in the semiconductor die. Moreover, the length of the current path between different VDD current solder balls and bumps may be different. These factors can result in higher parasitic inductance, larger on-die capacitance, uneven current distribution and high-voltage drops in the semiconductor die.

DESCRIPTION OF THE DRAWINGS

FIG. 5 is a perspective view of a bottom surface of the semiconductor die positioned for mounting on a top surface of the substrate according to embodiments of the present technology.

FIGS. 6A and 6B are two embodiments of a semiconductor package according to embodiments of the present technology.

FIG. 8 is a perspective view of a semiconductor package mounted on a top surface of a host device according to embodiments of the present technology.

FIG. 9 is a bottom view of a substrate including a conventional pattern of solder balls.

FIG. 10 is a bottom view of a semiconductor die including a conventional pattern of solder bumps.

FIG. 13 is an exploded edge view of a semiconductor die, substrate and host device according to embodiments of the present technology.

DETAILED DESCRIPTION

The present technology will now be described with reference to the figures, which in embodiments, relate to a semiconductor device including a semiconductor die mounted on a package substrate. The package substrate includes a pattern of solder balls which is complementary to a pattern of solder bumps on the semiconductor die. These complementary patterns of solder balls and solder bumps minimize current paths between the solder balls and solder bumps, and provide current paths between the solder balls and solder bumps of relatively uniform lengths. While the balls on the substrate are referred to occasionally herein as solder balls, it is understood that the balls on the substrate may be formed of any of a variety of conductive materials instead of, or in addition to, solder. Similarly, while the bumps on the semiconductor die are referred to occasionally herein as solder bumps, it is understood that the bumps on the semiconductor die may be formed of any of a variety of conductive materials instead of, or in addition to, solder.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

Figure 1:
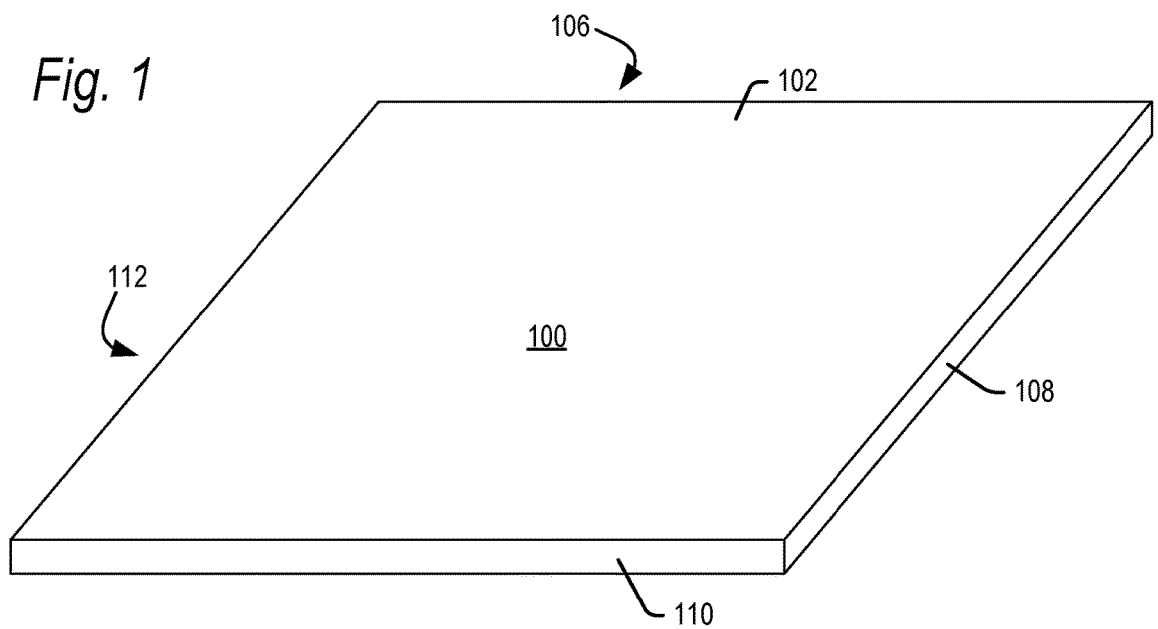
FIG. 1 is a top perspective view of a semiconductor die according to embodiments of the present technology.
Figure 2:
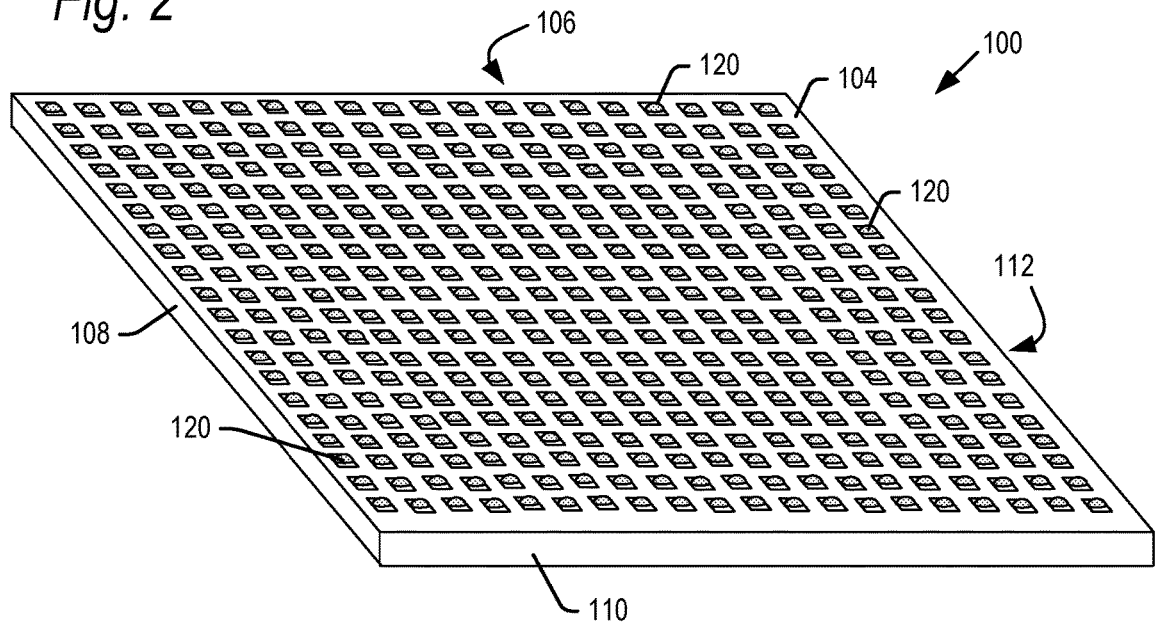
FIG. 2 is a bottom perspective view of a semiconductor die including a pattern of solder bumps according to embodiments of the present technology.

FIGS. 1 and 2 are perspective views of a top surface 102 and bottom surface 104, respectively, of a semiconductor die 100 according to embodiments of the present technology. Semiconductor die 100 may have four edges 106-112, and may either be square or rectangular in shape. Rounded shapes are contemplated in further embodiments. The bottom surface 104 may include a pattern of bumps 120 (some of which are labeled) used for transferring signals and other currents to and from the semiconductor die 100. As explained hereinafter, certain of the bumps 120 are designated as VDD bumps for carrying the high-voltage VDD current, and certain other bumps 120 are designated as VSS bumps for carrying the low-voltage VSS current.

In embodiments, the semiconductor die 100 may be a flip-chip controller die, such as for example an ASIC. However, it is understood the semiconductor die 100 may be other types of semiconductor dies including for example non-volatile memory dies such as 2D NAND flash memory, 3D BiCS (Bit Cost Scaling), V-NAND, or volatile memory dies such as an SDRAM, DDR SDRAM, LPDDR and GDDR.

Figure 3:
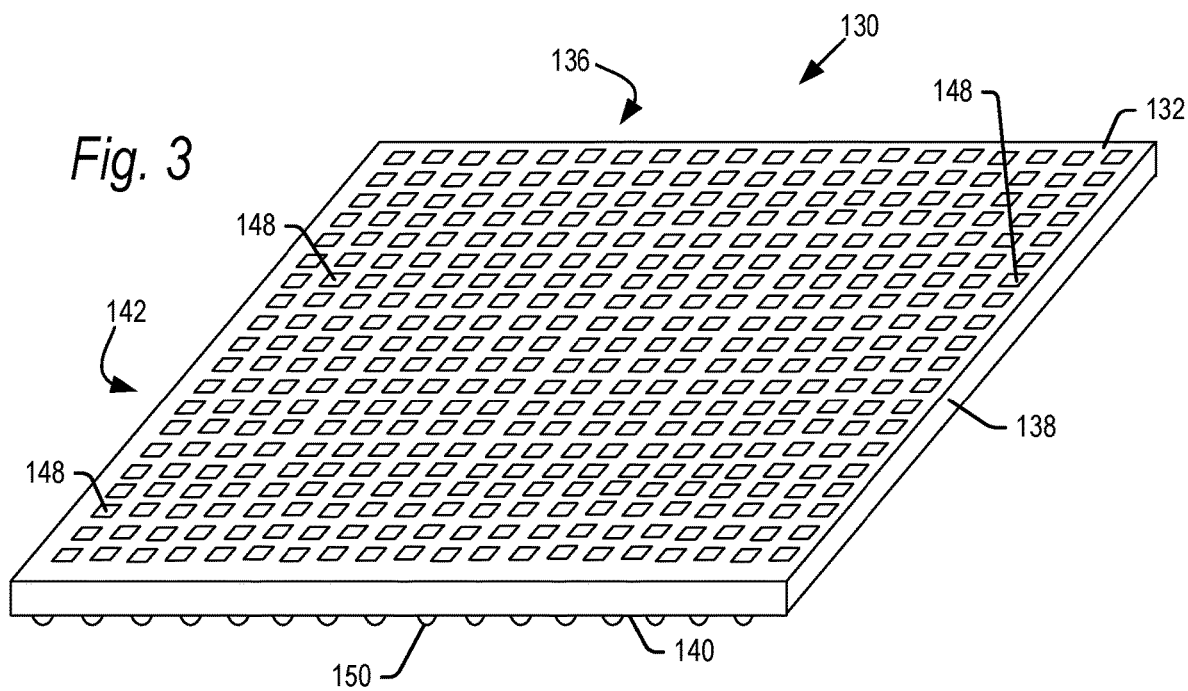
FIG. 3 is a top perspective view of a substrate including a pattern of contact pads according to embodiments of the present technology.
Figure 4:
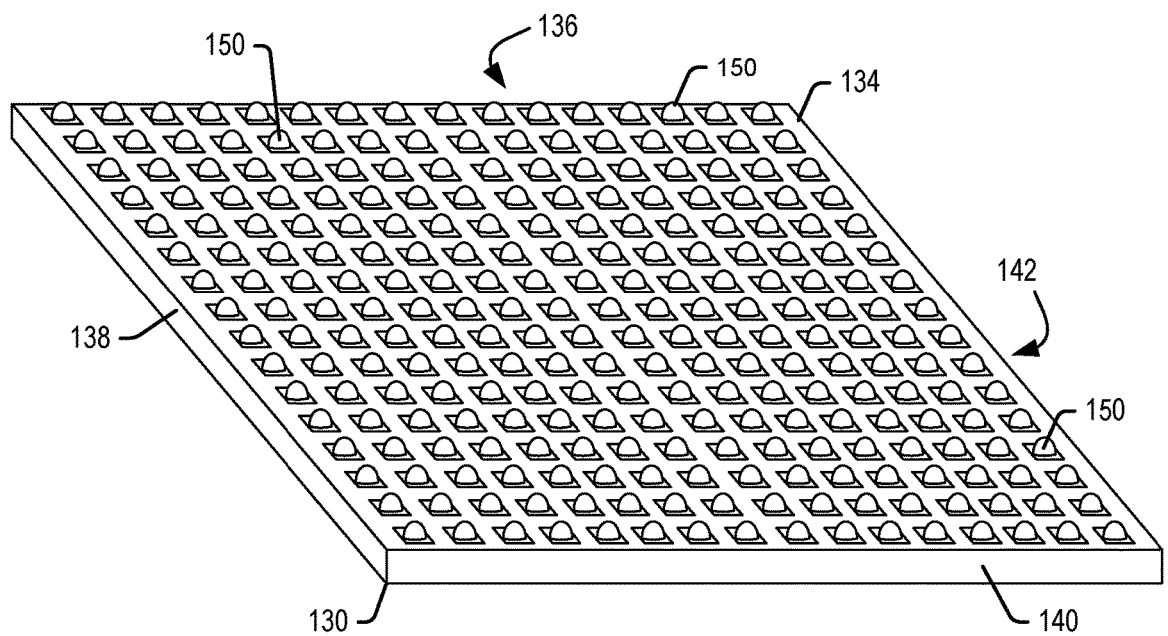
FIG. 4 is a bottom perspective view of a substrate including a pattern of solder balls according to embodiments of the present technology.

FIGS. 3 and 4 are perspective views of a top surface 132 and bottom surface 134, respectively, of a substrate 130 according to embodiments of the present technology. Substrate 130 may have four edges 136-142, and may either be square or rectangular in shape. Rounded shapes are contemplated in further embodiments. In embodiments, the substrate 130 may have the same footprint as semiconductor die 100. The top surface 132 may include a pattern of contact pads 148 (some of which are labeled) used for transferring signals and other currents between the substrate 130 and the semiconductor die 100. In particular, as explained hereinafter, the bumps 120 of the semiconductor die may bond to the contact pads 148 of the substrate 130. As such, the number, position and pattern of the contact pads 148 may match the number, position and pattern of the bumps 120. In further embodiments, there may be more contact pads 148 then there are bumps 120.

The bottom surface 134 may include a pattern of balls 150 (some of which are labeled) used for transferring signals and other currents between the substrate 130 and a host device. As explained hereinafter, certain of the balls 150 are designated as VDD balls for carrying the high-voltage VDD current, and certain other balls 150 are designated as VSS balls for carrying the low-voltage VSS current.

The substrate 130 may be formed at any of various dielectric cores having a pattern of copper pads, traces and/or other conductors on the top and bottom surfaces 132, 134 and a series of vias 154 (FIG. 13) electrically coupling the conductors on the top and bottom surfaces. The core may be formed of various materials such as for example FR4, FR5, PTFE and/or various polyamide or ceramic materials.

Referring now to the perspective view of FIG. 5, the bottom surface 104 of semiconductor die 100 may be bonded to the top surface 132 of substrate 130. When bonded together, the respective bumps 120 of the semiconductor die 100 mate with and are coupled to contact pads 148. Bonding of the semiconductor die 100 to substrate 130 may be accomplished under heat and pressure until the bumps 120 reflow and cure, forming a physical bond and an electrical coupling between respective bumps 120 and contact pads 148.

Once bonded together, the semiconductor die 100 and substrate 130 form a semiconductor package 160 as shown for example in FIG. 6A. In the embodiment shown in FIG. 6A, the semiconductor die 100 and substrate 130 may have the same footprint. In a further embodiment shown in FIG. 6B, the substrate 130 may be larger than the semiconductor die 100. In embodiments, the conductive bumps 120 may comprise entirely VDD and VSS solder bumps. In further embodiments, such as shown for example in FIG. 6B where the substrate 130 is larger than the die 100, the conductive bumps 120 may comprise VDD and VSS solder bumps, together with general input/output (I/O) bumps. In such embodiments, the VDD and VSS solder bumps may be concentrated in a center region of the semiconductor die 100, with the general I/O bumps surrounding the VDD and VSS solder bumps.

Figure 7:
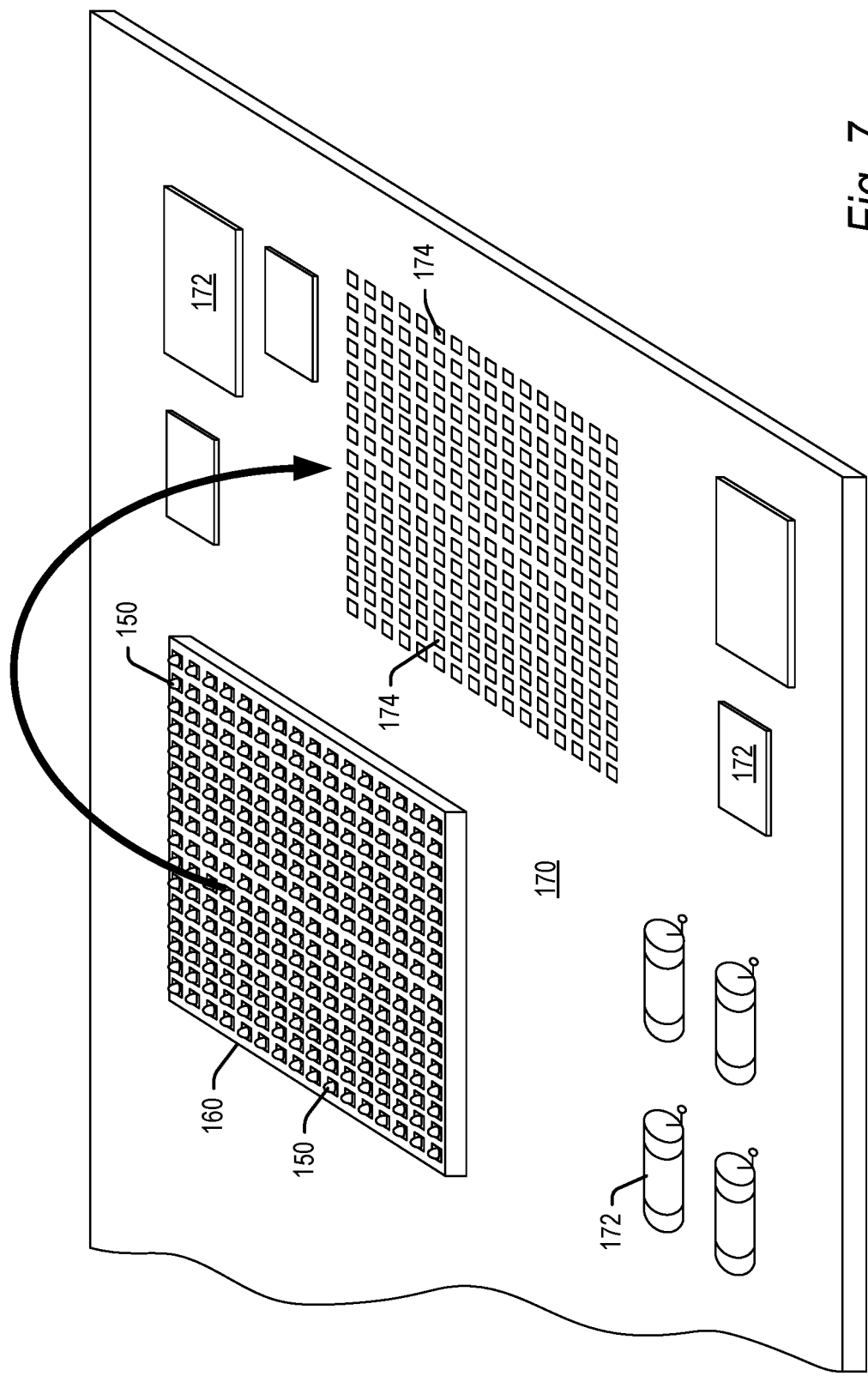
FIG. 7 is a perspective view of a bottom surface of a semiconductor package positioned for mounting on a top surface of a host device according to embodiments of the present technology.

Coupling of the semiconductor die 100 to substrate 130 forms a semiconductor package 160 as shown in FIG. 7. The semiconductor package 160 of FIG. 7 shows a bottom surface 134 of the substrate 130 including solder balls 150. FIG. 7 also shows a host device 170, which may for example be a printed circuit board. The printed circuit board may include other electronic components 172, as well as a pattern of contact pads 174 matching the pattern of solder balls 150 on the semiconductor package 160. The electronic components may include passive devices such as resistors, capacitors and/or inductors, as well as other semiconductor packages including possibly other packages 160 in accordance with the present technology.

When bonded together, the respective balls 150 of the semiconductor package 160 mate with and are coupled to contact pads 174 of the host device 170 (FIG. 8). Bonding of the semiconductor package 160 to the host device 170 may be accomplished under heat and pressure until the balls 150 reflow and cure, forming a physical bond and an electrical coupling between respective balls 150 and contact pads 174.

As described in the Background section, in the standard approach, the solder balls on a substrate carrying VDD current were arranged around an outer periphery of the substrate. Low-voltage current, VSS, solder balls are located within a center portion of the bottom surface of the substrate. FIG. 9 is a bottom view of a conventional substrate 50 including a pattern of solder balls 52 on a bottom surface 54, including VDD solder balls 52a around an outer periphery and VSS solder balls 52b in the center. On the semiconductor side, the bumps carrying the high-voltage VDD current and the low-voltage VSS current art traditionally in alternating rows. FIG. 10 is a bottom view of a conventional semiconductor die 60 including a pattern of solder bumps 62 on a bottom surface 64, including VDD solder bumps 62a in alternating rows with VSS solder bumps 62b in the center.

This configuration of solder balls on the substrate and bumps in the semiconductor die has certain drawbacks. For example, there can be a relatively long current path for the high-voltage VDD signal from a given solder ball 52a in the substrate 50 to a given bump 62a in the semiconductor die

60. Moreover, the length of the current path between different VDD current solder balls 52a and bumps 62a may be different. These factors can result in higher parasitic inductance, uneven current distribution and high-voltage drops in the semiconductor die 60, which usually leads to a demand for larger on-die capacitance.

Figure 12:
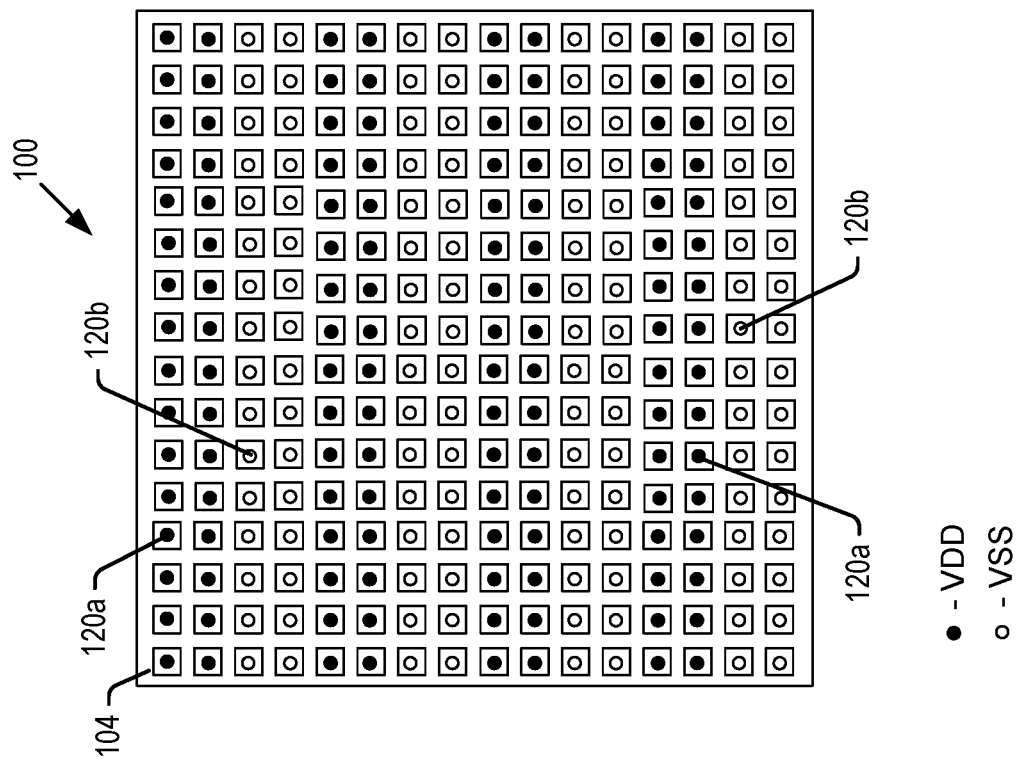
FIG. 12 is a bottom view of a semiconductor die including a pattern of solder bumps according to embodiments of the present technology.
Figure 11:
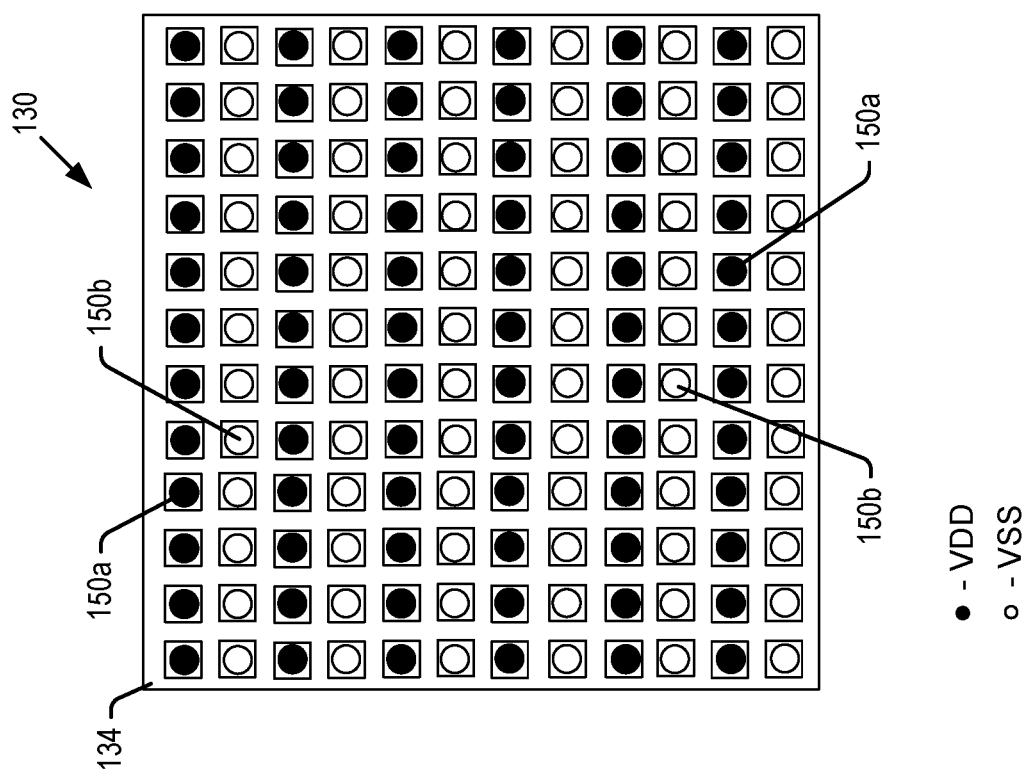
FIG. 11 is a bottom view of a substrate including a pattern of solder balls according to embodiments of the present technology.

In accordance with aspects of the present technology, the patterns of the substrate conductive balls and semiconductor die conductive bumps have been redesigned so as to be aligned with each other. Specifically, as shown in the views of FIGS. 11 and 12, the conductive balls 150 are provided in a pattern such that the VDD conductive balls 150a are provided in alternating rows with the VSS conductive balls 150b. The conductive bumps 120 are also provided with an aligned pattern such that the VDD conductive bumps 120a are provided in pairs of alternating rows with the VSS conductive bumps 120b. In embodiments, the ratio of bumps 120 to balls 150 is about 4 to 1, though this ratio may vary in further embodiments. In one example, the size and pitch (spacing in between) of the conductive bumps is about 80 μm and 162 μm, though both the size and pitch may vary in further embodiments. In one such further embodiment, the pitch between bumps may be 120 μm. In one example, the size and pitch of the conductive balls is about 0.50 mm and 0.65 mm, though both the size and pitch may vary in further embodiments. Thus, by doubling up the rows of conductive bumps, the pairs of VDD conductive bump rows are most closely aligned with the rows of the VDD conductive balls.

As used herein, a row or rows of the conductive bumps or balls may be horizontal as shown in FIGS. 11 and 12. As used herein, a row or rows of conductive bumps or balls may alternatively be rotated 90° so as to be vertical.

FIG. 13 is an exploded cross-sectional view showing the semiconductor die 100, substrate 130 and a host device 170. FIG. 13 shows the conductive bumps 120 on the bottom surface 104 of die 100, including VDD bumps 120a and VSS bumps 120b. Also shown are the contact pads 148 in the top surface 132 of the substrate 130, as well as the conductive balls 150 in the bottom surface 134, including VDD balls 150a and VSS balls 150b.

FIG. 13 further shows a redistribution pattern within the substrate 130 consisting of a number of metal traces 152 and vias 154 for distributing the currents and electrical signals from a given conductive ball 150 on the bottom surface 134 to a given contact pad 148 on the top surface 132, and vice-versa. The redistribution pattern shown is by way of example only, and may vary in further embodiments.

Figure 14:
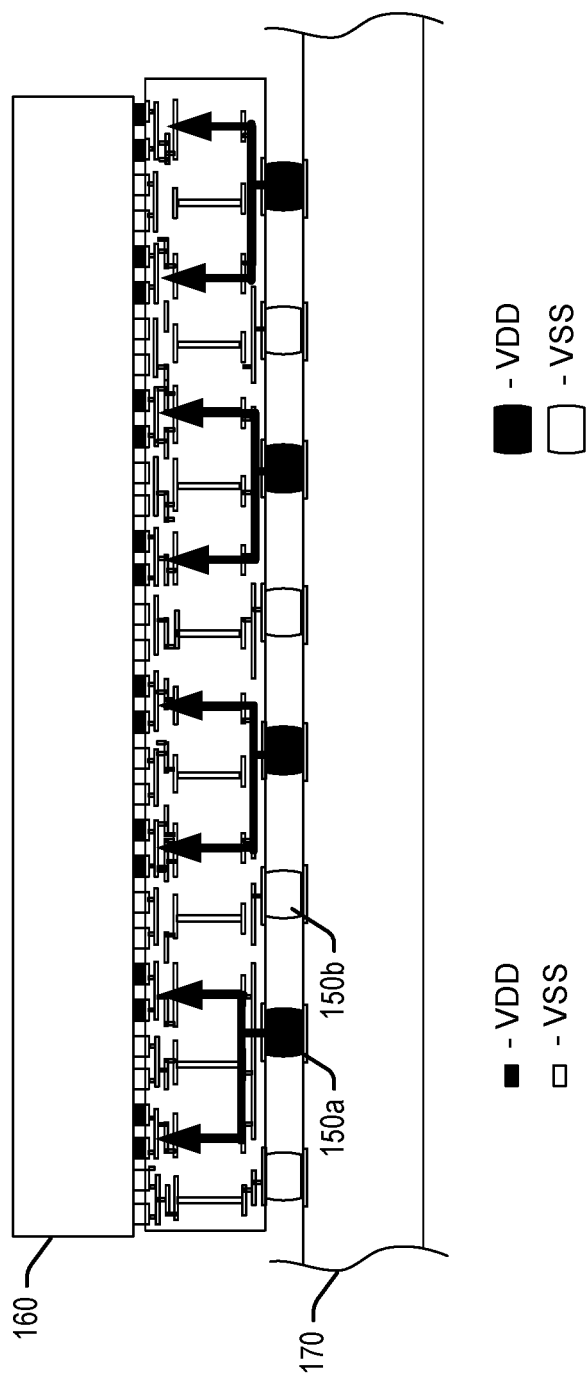
FIG. 14 is an edge view of a semiconductor package comprising a semiconductor die and substrate, mounted on the host device, and showing the positive terminalpositive terminal VDD current path through the semiconductor package according to embodiments of the present technology.

FIG. 14 shows the conductive bumps 120 of die 100 bonded to the contact pads 148 of substrate 130, and the conductive balls 150 of substrate 130 bonded to the contact pads 174 of the host device. FIG. 14 further shows examples of current flow pathways (using arrows) of the positive terminalpositive terminal current VDD from the conductive balls 150a on the substrate 130 to the conductive bumps 120a on the semiconductor die 100. As seen, all of the current pathways are minimized and approximately the same length from the conductive balls 150a to the conductive bumps 120a.

Minimizing the distance that the VDD current travels has advantages in improving the PDN (power distribution network) of the package 160. The power distribution consists of the above-described electrical interconnections between the conductive balls 150 and the conductive bumps 120 on die 100 that locally distribute power and return current within the die 100. Such improvements in the PDN include reducing voltage irregularities, minimizing parasitic inductance and minimizing on-die capacitance. Additionally, providing current pathways that are generally the same length also reduces voltage irregularities, such as uneven current distribution and high-voltage drops in the semiconductor die 100.

The present technology may make use of CuBOP (copper bump on pad), where fine-pitch conductive bumps 120 of the semiconductor die 100 are mounted on the contact pads 148 of substrate 130. Such technology can use micro-vias (154) within the substrate 130 for fine pitch connections within the substrate. One the one hand, the use of CuBOP and micro-vias simplifies routing through the substrate 130. However, the use of CuPOP and micro-vias can lead to increases in planes impedance and a reduction in PDN quality.

The present technology provides a bump/ball arrangement that balances these countervailing interests and maximizes PDN. Performing a power integrity analysis of the bump/ball arrangement of the present technology (as shown for example in FIGS. 11-14) shows distinct advantages of the present technology over a conventional bump/ball arrangement (as shown in FIGS. 9-10). As between the two designs, the present technology provided advantages in lower RLC-parasitic parameters, higher self-resonant frequency and low generated self-noise, improving PDN parameters by as much as 40% over a conventional bump/ball arrangement.

In embodiments described above, a pair of rows of bumps 120a carrying the positive terminalpositive terminal VDD current alternate with a pair of rows of bumps 120b carrying the negative terminal VSS current. In further embodiments, there may be more than two rows of bumps in the pattern of alternating rows. For example, there may be three rows of bumps 120a alternating with three rows of bumps 120b. There may be four or more rows of bumps 120a alternating with four or more bumps 120b in further embodiments.

In summary, an example of the present technology relates to a semiconductor device, comprising: a semiconductor die comprising first and second major planar surfaces, and a pattern of electrically conductive bumps on the second surface; and a substrate comprising: third and fourth major planar surfaces, a plurality of contact pads on the third surface, the semiconductor die configured to mount to the substrate by the conductive bumps mounting to the plurality of contact pads, a pattern of electrically conductive balls on the fourth surface, and electrically conductive traces and vias within an interior of the substrate, configured to transfer a current between the contact pads on the third surface and the conductive balls on the fourth surface, the substrate configured to be mounted to a host device by the conductive balls, and the substrate configured to transfer signals between the host device and the semiconductor die by the conductive balls and conductive bumps; wherein the patterns of conductive bumps and conductive balls are aligned with each other to minimize voltage irregularities.

In another example, the present technology relates to a semiconductor device, comprising: a semiconductor die comprising first and second major planar surfaces, and a pattern of electrically conductive bumps on the second surface, the plurality of conductive bumps comprising a first group of conductive bump configured to carry a positive terminalpositive terminal current and a second group of conductive bumps configured to carry a negative terminal current, the first and second groups of conductive bumps provided in alternating pairs of rows; and a substrate comprising: third and fourth major planar surfaces, a plurality of contact pads on the third surface, the semiconductor die configured to mount to the substrate by the conductive bumps mounting to the plurality of contact pads, a pattern of electrically conductive balls on the fourth surface, the plurality of conductive balls comprising a first group of conductive balls configured to carry the positive terminalpositive terminal current and a second group of conductive balls configured to carry the negative terminal current, the first and second groups of conductive balls provided in alternating rows, and electrically conductive traces and vias within an interior of the substrate, configured to transfer a current between the contact pads on the third surface and the conductive balls on the fourth surface, the substrate configured to be mounted to a host device by the conductive balls, and the substrate configured to transfer signals between the host device and the semiconductor die by the conductive balls and conductive bumps.

In a further example, the present technology relates to a semiconductor device, comprising: a semiconductor die comprising first and second major planar surfaces, and a pattern of electrically conductive bumps on the second surface, the plurality of conductive bumps comprising a first set of two or more rows of conductive bumps configured to carry a positive terminal current and a second set of two or more rows of conductive bumps configured to carry a negative terminal current, the first and second sets of rows alternating with each other on the second surface; and a substrate comprising: third and fourth major planar surfaces, a plurality of contact pads on the third surface, the semiconductor die configured to mount to the substrate by the conductive bumps mounting to the plurality of contact pads, a pattern of electrically conductive balls on the fourth surface, the plurality of conductive balls comprising a first group of conductive balls configured to carry the positive terminal current and a second group of conductive balls configured to carry the negative terminal current, the first and second groups of conductive balls provided in alternating rows, and electrically conductive traces and vias within an interior of the substrate, configured to transfer a current between the contact pads on the third surface and the conductive balls on the fourth surface, the substrate configured to be mounted to a host device by the conductive balls, and the substrate configured to transfer signals between the host device and the semiconductor die by the conductive balls and conductive bumps; wherein a single row of conductive balls carrying a positive terminal current is aligned with the first set of rows of conductive bumps carrying the positive terminal current.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
   a semiconductor die comprising first and second surfaces, and a pattern of electrically conductive bumps on the second surface; and
   a substrate comprising:
      third and fourth surfaces,
      a plurality of contact pads on the third surface, the semiconductor die configured to mount to the substrate by the conductive bumps mounting to the plurality of contact pads,
      a pattern of electrically conductive balls on the fourth surface, and
      electrically conductive traces and vias within an interior of the substrate, configured to transfer a current between the contact pads on the third surface and the conductive balls on the fourth surface,
      the substrate configured to be mounted to a host device by the conductive balls, and the substrate configured to transfer signals between the host device and the semiconductor die by the conductive balls and conductive bumps;
   wherein the patterns of conductive bumps and conductive balls are aligned with each other to minimize voltage irregularities; and
   wherein a single row of conductive balls carrying a positive terminal current is aligned with a pair of rows of conductive bumps carrying the positive terminal current.

2. The semiconductor device of claim 1, wherein rows of conductive balls carrying a positive terminal current are aligned with rows of conductive bumps carrying the positive terminal current.

3. The semiconductor device of claim 1, wherein rows of conductive balls carrying a negative terminal current are aligned with rows of conductive bumps carrying the negative terminal current.

4. The semiconductor device of claim 1, wherein a single row of conductive balls carrying a negative terminal current is aligned with a pair of rows of conductive bumps carrying the negative terminal current.

5. The semiconductor device of claim 1, wherein the semiconductor die is a controller die.

6. The semiconductor device of claim 1, wherein the conductive bumps are formed of solder.

7. The semiconductor device of claim 1, wherein the conductive balls are formed of solder.

8. The semiconductor device of claim 1, wherein one or more rows of the conductive balls carrying a positive terminal current alternate with one or more rows of conductive balls carrying a negative terminal current.

9. The semiconductor device of claim 8, wherein pairs of rows of the conductive bumps carrying the positive terminal current alternate with pairs of rows of the conductive bumps carrying the negative terminal current.

10. A semiconductor device, comprising:
    a semiconductor die comprising first and second surfaces, and a pattern of electrically conductive bumps on the second surface, the plurality of conductive bumps comprising a first group of conductive bump configured to carry a positive terminal current and a second group of conductive bumps configured to carry a negative terminal current, the first and second groups of conductive bumps provided in alternating pairs of rows; and
    a substrate comprising:
       third and fourth surfaces,
       a plurality of contact pads on the third surface, the semiconductor die configured to mount to the substrate by the conductive bumps mounting to the plurality of contact pads,
       a pattern of electrically conductive balls on the fourth surface, the plurality of conductive balls comprising a first group of conductive balls configured to carry the positive terminal current and a second group of conductive balls configured to carry the negative terminal current, the first and second groups of conductive balls provided in alternating rows, and electrically conductive traces and vias within an interior of the substrate, configured to transfer a current between the contact pads on the third surface and the conductive balls on the fourth surface, the substrate configured to be mounted to a host device by the conductive balls, and the substrate configured to transfer signals between the host device and the semiconductor die by the conductive balls and conductive bumps;

wherein a single row of conductive balls carrying a negative terminal current is aligned with a pair of rows of conductive bumps carrying the negative terminal current.

11. The semiconductor device of claim 10, wherein the rows of conductive bumps and conductive balls are aligned with each other to minimize voltage irregularities.

12. The semiconductor device of claim 10, wherein a single row of conductive balls carrying a positive terminal current is aligned with a pair of rows of conductive bumps carrying the positive terminal current.

13. A semiconductor device, comprising:
a semiconductor die comprising first and second surfaces, and a pattern of electrically conductive bumps on the second surface, the plurality of conductive bumps comprising a first set of two or more rows of conductive bumps configured to carry a positive terminal current and a second set of two or more rows of conductive bumps configured to carry a negative terminal current, the first and second sets of rows alternating with each other on the second surface; and a substrate comprising:
third and fourth surfaces,
a plurality of contact pads on the third surface, the semiconductor die configured to mount to the substrate by the conductive bumps mounting to the plurality of contact pads,
a pattern of electrically conductive balls on the fourth surface, the plurality of conductive balls comprising a first group of conductive balls configured to carry the positive terminal current and a second group of conductive balls configured to carry the negative terminal current, the first and second groups of conductive balls provided in alternating rows, and
electrically conductive traces and vias within an interior of the substrate, configured to transfer a current between the contact pads on the third surface and the conductive balls on the fourth surface,
the substrate configured to be mounted to a host device by the conductive balls, and the substrate configured to transfer signals between the host device and the semiconductor die by the conductive balls and conductive bumps;
wherein a single row of conductive balls carrying a positive terminal current is aligned with the first set of rows of conductive bumps carrying the positive terminal current.

14. The semiconductor device of claim 13, wherein a single row of conductive balls carrying a negative terminal current is aligned with the second set of rows of conductive bumps carrying the negative terminal current.

* * * * *